(12) United States Patent
Yuan et al.

(10) Patent No.: US 12,284,872 B2
(45) Date of Patent: Apr. 22, 2025

(54) DISPLAY PANEL AND PREPARATION METHOD THEREOF, AND DISPLAY DEVICE

(71) Applicant: Xiamen Tianma Microelectronics Co., Ltd., Xiamen (CN)

(72) Inventors: Yong Yuan, Xiamen (CN); Shui He, Xiamen (CN); Feng Xie, Xiamen (CN)

(73) Assignee: XIAMEN TIANMA MICROELECTRONICS CO., LTD., Xiamen (CN)

( * ) Notice: Subject to any disclaimer, the term of this patent is extended or adjusted under 35 U.S.C. 154(b) by 698 days.

(21) Appl. No.: 17/550,732

(22) Filed: Dec. 14, 2021

(65) Prior Publication Data

US 2022/0109037 A1    Apr. 7, 2022

(30) Foreign Application Priority Data

May 25, 2021   (CN) .......................... 202110574112.8

(51) Int. Cl.
| | | |
|---|---|---|
| H01L 27/14 | (2006.01) | |
| G09G 3/3233 | (2016.01) | |
| H10K 59/121 | (2023.01) | |
| H10K 59/124 | (2023.01) | |
| H10K 71/00 | (2023.01) | |
| H10K 77/10 | (2023.01) | |

(Continued)

(52) U.S. Cl.
CPC ....... *H10K 59/1213* (2023.02); *G09G 3/3233* (2013.01); *H10K 59/124* (2023.02); *H10K 71/00* (2023.02); *H10K 77/111* (2023.02); *H01L 27/1225* (2013.01); *H01L 27/1248* (2013.01); *H01L 27/1251* (2013.01); *H01L 29/78675* (2013.01); *H01L 29/7869* (2013.01); *H01L 29/78696* (2013.01); *H10K 59/1201* (2023.02); *H10K 2102/311* (2023.02)

(58) Field of Classification Search
CPC .. H10K 59/1213; H10K 59/124; H10K 71/00; H10K 77/111; H10K 59/1201; H10K 2102/311; G09G 3/3233; H01L 27/1225; H01L 27/1248; H01L 27/1251; H01L 29/78675; H01L 29/7869; H01L 29/78696; H01L 27/1229; H01L 27/127; Y02E 10/549
USPC ...................................... 257/59, 72
See application file for complete search history.

(56) References Cited

U.S. PATENT DOCUMENTS

| 11,411,122 B2 * | 8/2022 | Lee .................. H01L 27/124 |
| 2021/0150985 A1 * | 5/2021 | Li ................... G09G 3/2003 |

FOREIGN PATENT DOCUMENTS

| CN | 110620120 A | 12/2019 |
| CN | 110828486 A | 2/2020 |

(Continued)

*Primary Examiner* — Tan N Tran
(74) *Attorney, Agent, or Firm* — Alston & Bird LLP (57) ABSTRACT

Provided are a display panel and a preparation method thereof, and a display device. The display panel includes a base substrate; a first transistor, a second transistor, a third transistor; and a pixel circuit supplying a drive current to a display element, and a driver circuit supplying a drive signal to the pixel circuit; where the driver circuit includes the first transistor, and the pixel circuit includes the second transistor and the third transistor; and the subthreshold swing of the first transistor is SS1, and the subthreshold swing of the second transistor is SS2, where SS1<SS2.

19 Claims, 7 Drawing Sheets

(51) Int. Cl.
  *H01L 27/12*    (2006.01)
  *H01L 29/786*   (2006.01)
  *H10K 59/12*    (2023.01)
  *H10K 102/00*   (2023.01)

(56) References Cited

FOREIGN PATENT DOCUMENTS

| | | |
|---|---|---|
| CN | 112652633 A | 4/2021 |
| CN | 112768470 A | 5/2021 |

* cited by examiner

FIG. 13 understand# DISPLAY PANEL AND PREPARATION METHOD THEREOF, AND DISPLAY DEVICE

CROSS-REFERENCE TO RELATED APPLICATION

This application claims priority to Chinese Patent Application No. 202110574112.8 filed May 25, 2021, the disclosure of which is incorporated herein by reference in its entirety.

FIELD

Embodiments of the present disclosure relate to the field of display technologies and, in particular, to a display panel and a preparation method thereof, and a display device.

BACKGROUND

An organic light-emitting diode (OLED) display panel is widely applied in the field of displays due to its advantages of self-illumination, high contrast, thin thickness, fast reaction speed, and applicableness to a flexible panel.

The OLED element of the OLED display panel is a current-driven element and thus needs to be provided with a corresponding pixel circuit and a corresponding driver circuit. The driver circuit supplies a drive signal to the pixel circuit so that the pixel circuit supplies a drive current to the OLED element to drive the OLED element to emit light. The driver circuit and the pixel circuit of the OLED display panel each are provided with transistors. In the related art, generally, the transistor in the driver circuit and the transistor in the pixel circuit are formed by using the same process and have the same subthreshold swing. For the transistor in the driver circuit, when the subthreshold swing is large, the start of the transistor is delayed on, thereby failing to achieve high-frequency driving.

SUMMARY

Embodiments of the present disclosure provide a display panel and a preparation method thereof, and a display device to improve the display effect of the display panel.

In a first aspect, an embodiment of the present disclosure provides a display panel. The display panel includes: a base substrate; a first transistor, where the first transistor includes a first active layer, a first gate, a first source, and a first drain, where the first active layer contains silicon; a second transistor, where the second transistor includes a second active layer, a second gate, a second source, and a second drain, where the second active layer contains silicon; a third transistor, where the third transistor includes a third active layer, a third gate, a third source, and a third drain, where the third active layer contains an oxide semiconductor; and a pixel circuit and a driver circuit, where the pixel circuit supplies a drive current to a display element of the display panel, and the driver circuit supplies a drive signal to the pixel circuit. The driver circuit includes the first transistor, and the pixel circuit includes the second transistor and the third transistor. The subthreshold swing of the first transistor is SS1, and the subthreshold swing of the second transistor is SS2, where SS1<SS2.

In a second aspect, an embodiment of the present disclosure further provides a preparation method for a display panel. The preparation method is used for preparing the preceding display panel and includes the steps described below. In S1, a base substrate is prepared. In S2, the following components are formed on the base substrate: a first active layer and a first gate, where the first active layer contains silicon; a second active layer and a second gate, where the second active layer contains silicon; a third active layer and a third gate, where the third active layer contains an oxide semiconductor; and a multilayer interlayer insulating layers, including a first insulating layer. In S3, a second via hole is formed in the multilayer interlayer insulating layer, where the second via hole extends to the second active layer. In S4, dehydrogenation treatment is performed on the display panel. In S5, a first via hole is formed in the multilayer interlayer insulating layer, where the first via hole extends to the first active layer. In S6, a third via hole is formed in at least part of insulating layers in the multilayer interlayer insulating layer, where the third via hole extends to the third active layer. In S7, a second source and/or a second drain connected to the second active layer are formed on the second via hole, a first source and/or a first drain connected to the first active layer are formed on the first via hole, and a third source and/or a third drain connected to the third active layer are formed on the third via hole.

In a third aspect, an embodiment of the present disclosure further provides a display device. The display device includes the preceding display panel. The display panel provided by the embodiments of the present disclosure includes a base substrate; a first transistor, where the first transistor includes a first active layer, a first gate, a first source, and a first drain, and the first active layer contains silicon; a second transistor, where the second transistor includes a second active layer, a second gate, a second source, and a second drain, and the second active layer contains silicon; a third transistor, where the third transistor includes a third active layer, a third gate, a third source, and a third drain, and the third active layer contains an oxide semiconductor; and a pixel circuit and a driver circuit, where the pixel circuit supplies a drive current to a display element of the display device, and the driver circuit supplies a drive signal to the pixel circuit; where the driver circuit includes the first transistor, and the pixel circuit includes the second transistor and the third transistor; and the subthreshold swing of the first transistor is SS1, and the subthreshold swing of the second transistor is SS2, where SS1<SS2.

DETAILED DESCRIPTION

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

Terms used in the embodiments of the present disclosure are merely used for describing specific embodiments and not intended to limit the present disclosure. It is to be noted that nouns of locality, including "above", "below", "left", and "right", used in the embodiments of the present disclosure are described from the angles illustrated in the drawings and are not to be construed as a limitation to the embodiments of the present disclosure. Additionally, in the context, it is to be understood that when an element is formed "on" or "below" another element, the element may be directly formed "on" or "below" another element, or may be indirectly formed "on" or "below" another element via an intermediate element. The terms "first", "second", and the like are merely used for description and used to distinguish between different components rather than indicate any order, quantity, or importance. For those of ordinary skill in the art, the preceding terms can be construed according to specific situations in the present disclosure.

Figure 1:
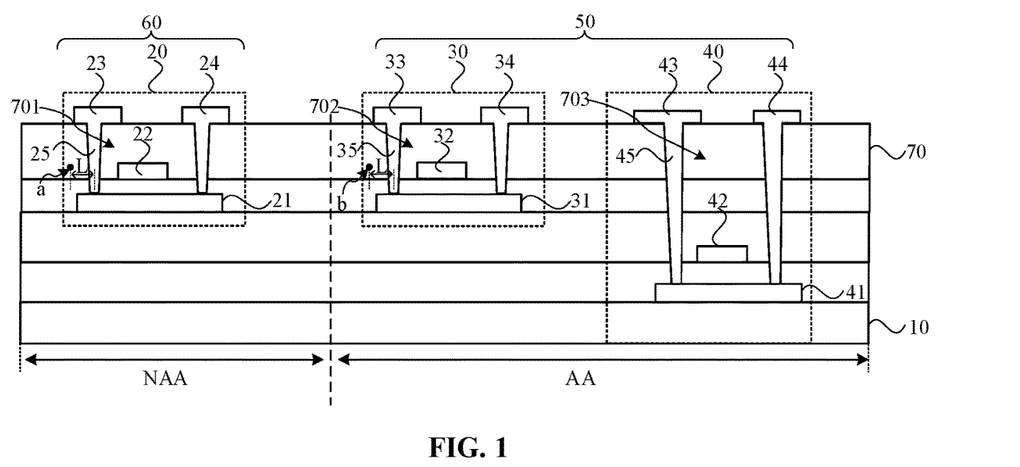
FIG. 1 is a structural diagram of a display panel according to an embodiment of the present disclosure.

FIG. 1 is a structural diagram of a display panel according to an embodiment of the present disclosure. With reference to FIG. 1, the display panel provided by the embodiment of the present disclosure includes a base substrate 10; a first transistor 20, where the first transistor 20 includes a first active layer 21, a first gate 22, a first source 23, and a first drain 24, and the first active layer 21 contains silicon; a second transistor 30, where the second transistor 30 includes a second active layer 31, a second gate 32, a second source 33, and a second drain 34, and the second active layer 31 contains silicon; a third transistor 40, where the third transistor 40 includes a third active layer 41, a third gate 42, a third source 43, and a third drain 44, and the third active layer 44 contains an oxide semiconductor; and a pixel circuit 50 and a driver circuit 60, where the pixel circuit 50 supplies a drive current to a display element (not shown in FIG. 1) of the display device, and the driver circuit 60 supplies a drive signal to the pixel circuit 50; where the driver circuit 60 includes the first transistor 20, and the pixel circuit 50 includes the second transistor 30 and the third transistor 40; and the subthreshold swing of the first transistor 20 is SS1, and the subthreshold swing of the second transistor 30 is SS2, where SS1<SS2.

The base substrate 10 may be a rigid substrate such as a glass substrate, or may be a flexible substrate such as a polyimide substrate, and the base substrate may be selected according to the actual situation, which is not limited in the embodiment of the present disclosure. With reference to FIG. 1, the display panel includes a display area AA and a non-display area NAA. The non-display area NAA is located on at least one side of the display area AA. FIG. 1 is illustrated by using an example in which the non-display area NAA is located on one side of the display area AA, where the driver circuit 50 is located in the display area AA, and the driver circuit 60 is located in the non-display area NAA. The driver circuit 60 supplies a drive signal to the pixel circuit 50 in the display area AA to cause the pixel circuit 50 to drive a display element which is located in the same sub-pixel as the pixel circuit 50 to emit light, where the display element is an OLED, thereby achieving the display of the display panel. In an embodiment, the first transistor 20 is located in the driver circuit 60 in the non-display area NAA of the display panel, and multiple cascaded shift register circuits may be formed to supply a drive signal to the display area AA. The second transistor 30 and the third transistor 40 are located in the pixel circuit 60 in the display area AA of the display panel. For example, the second transistor 30 or the third transistor 40 may be a drive transistor in the pixel circuit, or may be a switch transistor.

In this embodiment, the first transistor 20, the second transistor 30, and the third transistor 40 may be bottom-gate transistors, or may be top-gate transistors. FIG. 1 is illustrated by using an example in which the first transistor 20, the second transistor 30, and the third transistor 40 are top-gate transistors, that is, the first gate 22 is located on a side of the first active layer 21 away from the base substrate 10, the second gate 32 is located on a side of the second active layer 31 away from the base substrate 10, and the third gate electrode 42 is located on a side of the third active layer 41 away from the base substrate 10. The first source 23, the first drain 24, the second source 33, the second drain 34, the third source 43, and the third drain 44 each are located on a side of the third gate 42 away from the base substrate 10, and each are insulated from the third gate 42. The first source 23, the first drain 24, the second source 33, the second drain 34, the third source 43, and the third drain 44 may be disposed in the same layer, thereby simplifying the process step. Additionally, the first active layer 21 in the first transistor 20 and the second active layer 31 in the second transistor contain silicon which may be polysilicon, that is, the first active layer 21 and the second active layer 31 are polysilicon active layers, and for example, are low temperature poly-silicon active layers. In the following embodiments are illustrated by using an example in which both the first active layer 21 and the second active layer 31 include LTPS active layers. The third active layer 41 in the third transistor 40 contains an oxide semiconductor, that is, the third active layer 41 is an oxide semiconductor active layer, and for example, is an indium gallium zinc oxide (IGZO) active layer. The following embodiments are illustrated by using an example in which the third active layer 41 includes an IGZO active layer. The low temperature poly-silicon thin film transistor has the advantages of high carrier mobility, fast response, and low power consumption, and the oxide semiconductor thin film transistor has the advantages of low leakage current.

The first transistor 20 is located in the driver circuit 60 in the non-display area NAA and is a switch transistor. The operation of the pixel circuit 50 includes a data write frame and a retention frame. At least one drive signal (a scan signal or a light emission control signal) needs to hop in both the data write frame and the retention frame. Therefore, the output signal frequency of the driver circuit 60 which supplies the drive signal to the pixel circuit 50 is required to be relatively large, and the output signal frequency of the driver circuit 60 is at least greater than the change frequency of a part of signals in the pixel circuit 50. As a result, the working state switch of the transistor in the driver circuit 60 becomes more frequent, which means that a faster response speed is required. For the transistor, the subthreshold swing affects the response speed of the transistor. The smaller the subthreshold swing is, the easier the transistor to respond. Therefore, in this embodiment, the subthreshold swing SS1 of the first transistor 20 is set to be less than the subthreshold swing SS2 of the second transistor 30 so that the driver circuit 60 has a faster response speed. The subthreshold swing of the transistor represents the change amount of a gate voltage required for ten-fold change of the source-drain current. The smaller the subthreshold swing is, the more sensitive the transistor is.

In the technical solution of the embodiment of the present disclosure, a driver circuit located in the frame area and the pixel circuit located in the display area are set so that the driver circuit supplies a drive signal to the pixel circuit and the pixel circuit supplies a drive current to the display element. The subthreshold swing of the first transistor in the driver circuit is set to be less than the subthreshold swing of the second transistor in the pixel circuit, that is, the subthreshold swing of the first transistor is small, so that the first transistor in the driver circuit has a faster response speed, thereby achieving high-frequency driving of the display panel. The subthreshold swing of the second transistor is large so that the second transistor in the pixel circuit has higher stability, thereby enabling the display to be more uniform under low brightness and thus improving the display effect of the display panel.

On the basis of the preceding embodiment, the hydrogen concentration in the first active layer 21 is higher than the hydrogen concentration in the second active layer 31.

It is to be understood that since for the LTPS active layer, hydrogen helps to repair the defects in the active layer of LTPS, when the hydrogen concentration is high, it is beneficial to repair more defects while the defects easily capture carriers, which leads to the increase of subthreshold swing. Therefore, when there is more hydrogen, there are fewer defects in the active layer and the subthreshold swing is smaller while when there is less hydrogen, the subthreshold swing is larger. In this embodiment, the hydrogen concentration in the first active layer 21 is set to be higher than the hydrogen concentration in the second active layer 31 so that the subthreshold swing SS1 of the first transistor 20 is less than the subthreshold swing SS2 of the second transistor 30.

In an embodiment, with continued reference to FIG. 1, the first transistor 20 includes a first insulating layer 70, where the first insulating layer 70 is located between the first source 23 or the first drain 24 and the first active layer 21, and the first insulating layer 70 extends to the second transistor 30 and is located between the second source 33 and the second active layer 31 or between the second drain 34 and the second active layer 31; the first insulating layer 70 is located in a first area 701 in the first transistor 20, the first insulating layer 70 is located in a second area 702 in the second transistor 20, and the hydrogen concentration in the first area 701 is higher than the hydrogen concentration in the second area 702.

The concentration of the first insulating layer 70 in the first area 701 is set to be higher than the concentration of the first insulating layer 70 in the second area 702 so that the hydrogen content in the film layer of the first transistor 20 can be reduced, thereby avoiding the reduction of subthreshold swing caused by hydrogen provided for the LTPS layer when the hydrogen concentration is large. In the specific implementation, the dehydrogenation treatment may be performed on the first insulating layer 70 of the second transistor in part or the whole AA area. After the dehydrogenation treatment, the hydrogen concentration of the first insulating layer 70 in the second area 702 decreases while the hydrogen concentration in the first area 701 remains.

In an embodiment, with continued reference to FIG. 1, the first source 23 is connected to the first active layer 21 through a first via hole 25, and the second source 33 is connected to the second active layer 31 through a second via hole 35; and the first via hole 25 passes through the first area 701 of the first insulating layer 70, and the second via hole 35 passes through the second area 702 of the first insulating layer 70; the hydrogen concentration on a side of the first insulating layer 70 adjacent to the first via hole 25 is C1, and the hydrogen concentration on a side of the first insulating layer 70 adjacent to the second via hole 35 is C2, where C1>C2.

The hydrogen concentration C1 of the first insulating layer 70 at a sidewall of the first via hole 25 is set to be higher than the hydrogen concentration C2 of the first insulating layer 70 at a sidewall of the second via hole 35 so that the hydrogen concentration in the vicinity area of the first active layer 21 is higher than the hydrogen concentration in the vicinity area of the second active layer 31, thereby facilitating the repair of defects in the first active layer 21 and thus reducing the subthreshold swing of the first transistor 20. In the specific implementation, the second via hole 35 may be formed before the dehydrogenation treatment is performed and hydrogen gas diffuses through the second via hole 35, while the dehydrogenation treatment is not performed after the first via hole 25 is formed, so that the hydrogen content at the sidewall of the first via hole 25 is higher than the hydrogen content at the sidewall of the second via hole 35.

In an embodiment, with continued reference to FIG. 1, the first insulating layer 70 further extends to the third transistor 40 and at least partially overlaps with the third active layer 41, and the first insulating layer 70 overlaps with the third active layer 41 in a third area 703; the hydrogen concentration in the first area 701 is higher than the hydrogen concentration in the third area 703.

The third transistor 40 is an oxide semiconductor transistor such as an IGZO transistor, and IGZO is very sensitive to hydrogen, both the second transistor 30 and the third transistor 40 are located in the pixel circuit area of the display area AA, and when the dehydrogenation treatment is performed after the second via hole 35 is formed, hydrogen gas in each film layer corresponding to the third transistor 40 located in the adjacent area is also released through the second via hole 35 while the first transistor 20 is located in the frame area of the non-display area NAA and the distance between the first transistor 20 and the pixel circuit 50 is much larger than the distance between the second transistor 30 and the third transistor 40. Therefore, the hydrogen concentration in the first area 701 is higher while the hydrogen concentration in the third area 703 is lower, which helps to prevent the third active layer 41 from being damaged and improving the stability of the third transistor 40.

In an embodiment, with continued reference to FIG. 1, the first insulating layer 70 is located on a side of the third active layer 41 away from the base substrate 10, and the third source 43 is connected to the third active layer 41 through a third via hole 45; the third via hole 45 passes through the third area 703 of the first insulating layer 70, and the hydrogen concentration on a side of the first insulating layer 70 adjacent to the third via hole 45 is C3, where C1>C3.

The description that the first insulating layer 70 is located on a side of the third active layer 41 away from the base substrate 10 is just illustrative, and in other embodiments, the first insulating layer 70 may be located between the third active layer 41 and the base substrate, and in this case, the third via hole 45 does not need to pass through the first insulating layer 70. In this embodiment, the third via hole 45 passes through the third area 703. In the specific implementation, the third via hole 45 is formed after the dehydrogenation is performed, but since the third via hole 45 is close to the second via hole 35, part of hydrogen gas is released through the second via hole 35, causing that the hydrogen content at the third via hole 45 is less than the hydrogen content at the first via hole 25, that is, C3<C1. In an embodiment, C3>C2. Since there is no via hole in the third area 703 when the dehydrogenation treatment is performed, the hydrogen removal degree in the third area 703 is weaker than the hydrogen removal degree in the second area 702 so that the hydrogen content at the third via hole 45 is greater than the hydrogen content at the second via hole 35.

It is understood that the first drain 24 is connected to the first active layer 21 through a via hole having the same structure as the first via hole 25, the second drain 34 is connected to the second active layer 31 through a via hole having the same structure as the second via hole 35, and the third drain 44 is connected to the third active layer 41 through a via hole with the same structure as the third via hole 45. In addition, multiple insulating layers need to be disposed between the adjacent active layer and the gate and between the gate and the source/drain according to the actual situation, where the first insulating layer is at least one of the multiple insulating layers.

Figure 2:
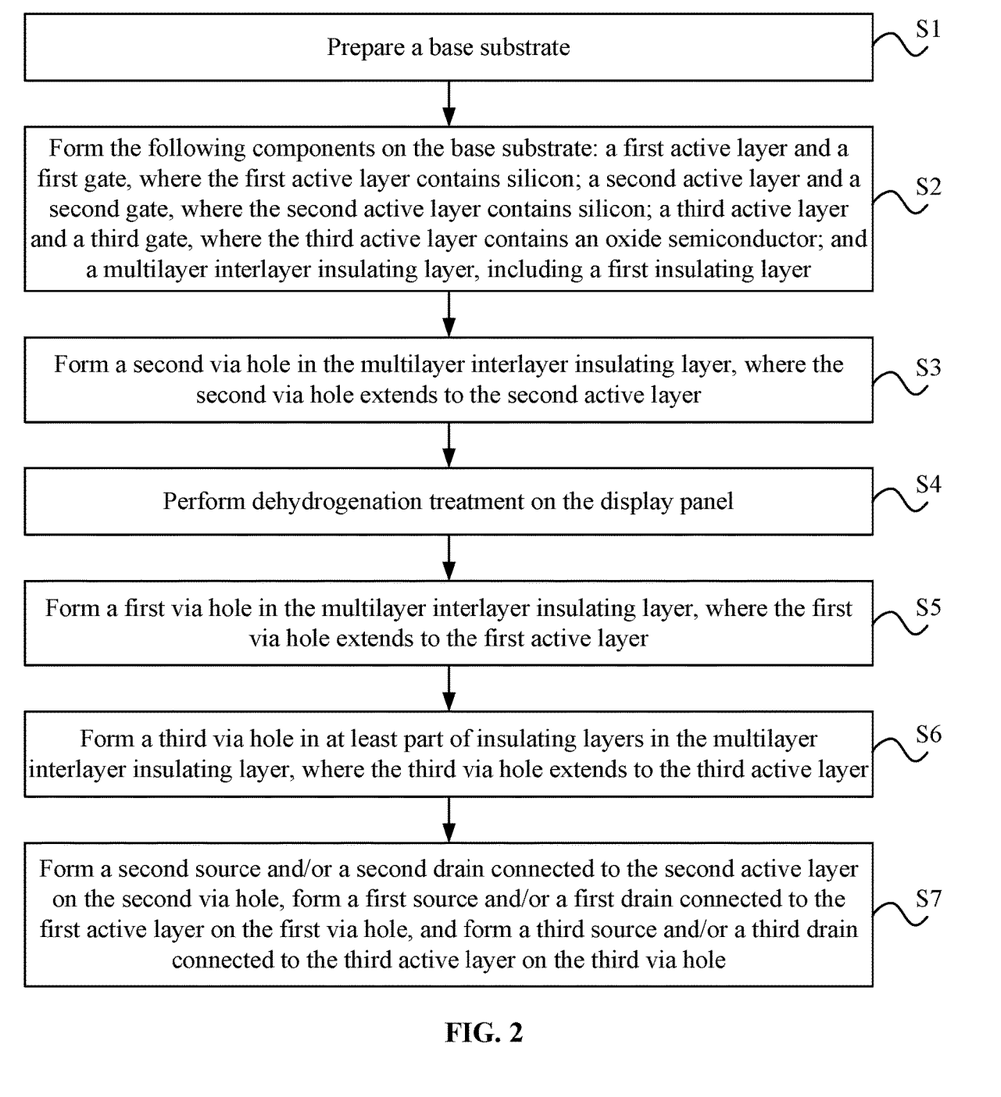
FIG. 2 is a flowchart of a preparation method for a display panel according to an embodiment of the present disclosure.

In order to achieve the preceding object, an embodiment of the present disclosure further provides a preparation method for a display panel. FIG. 2 is a flowchart of a preparation method for a display panel according to an embodiment of the present disclosure. With reference to FIG. 2, the preparation method for a display panel provided in this embodiment includes the steps described below.

In S1, a base substrate is prepared.

The base substrate may be a rigid substrate such as a glass substrate, or may be a flexible substrate such as a polyimide substrate, and the base substrate may be selected according to the actual situation, which is not limited in the embodiment of the present disclosure.

In S2, the following components are formed on the base substrate:
 a first active layer and a first gate, where the first active layer contains silicon;
 a second active layer and a second gate, where the second active layer contains silicon;
 a third active layer and a third gate, where the third active layer contains an oxide semiconductor; and
 a multilayer interlayer insulating layers, including a first insulating layer.

The display panel includes a pixel circuit located in a display area and a driver circuit located in a non-display area. The pixel circuit supplies a drive current to a display element of the display panel, and the driver circuit supplies a drive signal to the pixel circuit. The driver circuit includes a first transistor, and the pixel circuit includes a second transistor and a third transistor. The first transistor consists of a first active layer and a first gate, where the first active layer contains silicon. The second transistor consists of a second active layer and a second gate, where the second active layer contains silicon. The third transistor consists of a third active layer and a third gate, where the third active layer contains an oxide semiconductor. An insulating layer is disposed between two adjacent film layers to avoid the electrical contact between two film layers that do not need to be in electrical connection.

Figure 3:
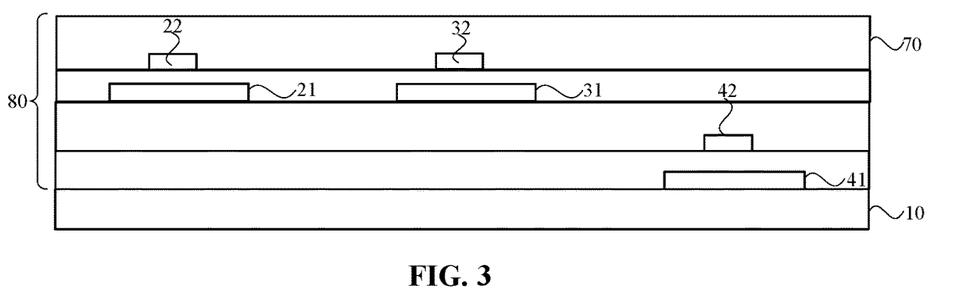
FIG. 3 is a structural diagram of a display panel formed after S2 of the preparation method according to an embodiment of the present disclosure.

For example, FIG. 3 is a structural diagram of a display panel formed after S2 of the preparation method according to an embodiment of the present disclosure. With reference to FIG. 3, a first active layer 21, a first gate 22, a second active layer 31, a second gate 32, a third active layer 41, a third gate 42, and multilayer interlayer insulating layer 80 including a first insulating layer 70 are formed on the base substrate 10.

In S3, a second via hole is formed in the multilayer interlayer insulating layer, where the second via hole extends to the second active layer.

Figure 4:
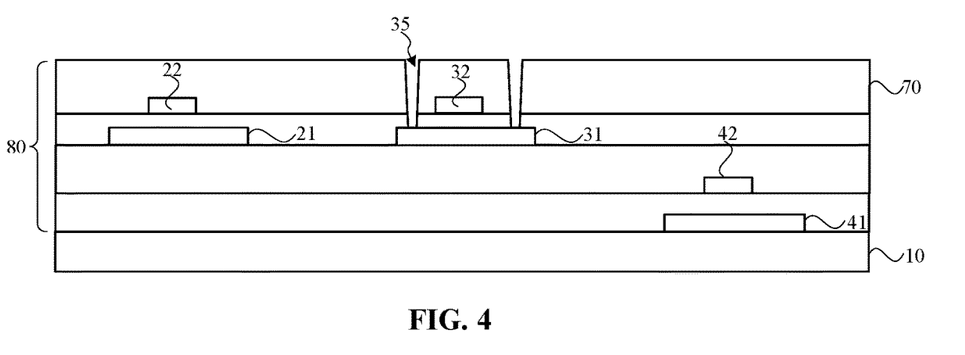
FIG. 4 is a structural diagram of a display panel formed after S3 of the preparation method according to an embodiment of the present disclosure.

For example, FIG. 4 is a structural diagram of a display panel formed after S3 of the preparation method according to an embodiment of the present disclosure. With reference to FIG. 4, two second via holes 35 are formed, where one is used for connecting the second source and the second active layer, and the other is used for connecting the second drain and the second active layer. In the specific implementation, the process steps for forming the second via hole 35 can be selected according to the existing preparation process, which is not limited in the embodiment of the present disclosure.

In S4, dehydrogenation treatment is performed on the display panel.

After the structure shown in FIG. 4 is formed in S3, the dehydrogenation treatment is performed on the panel. Since a second via hole 35 is disposed in the corresponding area of the second transistor, the hydrogen gas generated in the area near the second transistor in the dehydrogenation process will be released from the second via hole 35, and the influence on other areas is relatively small, so that the hydrogen concentration near the second transistor is reduced, which helps to increase the subthreshold swing of the second transistor.

In S5, a first via hole is formed in the multilayer interlayer insulating layer, where the first via hole extends to the first active layer.

Figure 5:
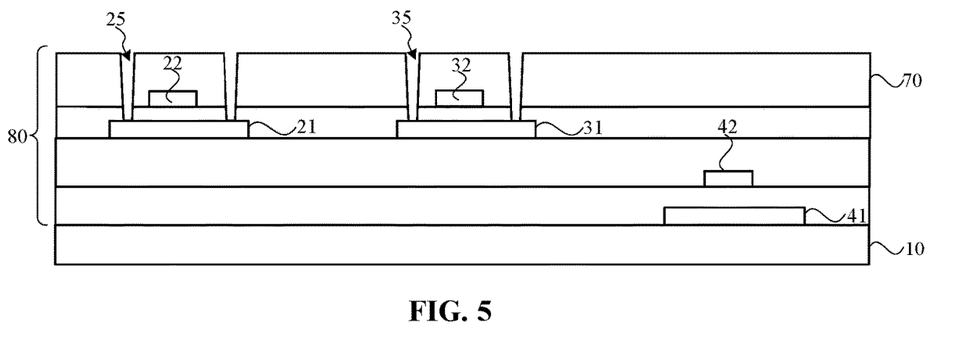
FIG. 5 is a structural diagram of a display panel formed after S5 of the preparation method according to an embodiment of the present disclosure.

After the dehydrogenation treatment, a first via hole connecting the first source and the first active layer and a first via hole connecting the first drain and the first active layer are formed. For example, FIG. 5 is a structural diagram of a display panel formed after S5 of the preparation method according to an embodiment of the present disclosure. With reference to FIG. 5, two first via holes 25 are formed, where one is used for connecting the first source and the first active layer, and another one is used for connecting the first drain and the first active layer. In the specific implementation, the process steps for forming the first via hole 25 may be the same as the process steps for forming the second via hole 35, and the process steps for forming the both holes are just different in order.

In S6, a third via hole is formed in at least part of insulating layers in the multilayer interlayer insulating layer, where the third via hole extends to the third active layer.

Figure 6:
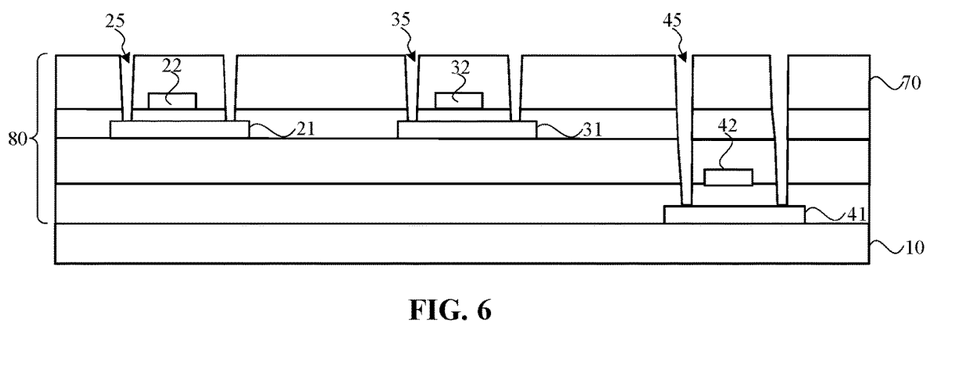
FIG. 6 is a structural diagram of a display panel formed after S6 of the preparation method according to an embodiment of the present disclosure.

Since the third active layer contains a metal oxide active layer an is generally in a layer different from the layers where the first active layer and the second active layer are respectively located, the depth of the third via hole is different from the depth of the first via hole or the second via hole. For example, FIG. 6 is a structural diagram of a display panel formed after S6 of the preparation method according to an embodiment of the present disclosure. With reference to FIG. 6, two third via holes 45 are formed, where one is used for connecting the third source and the third active layer, and another one is used for connecting the third drain and the third active layer.

It is to be noted that FIGS. 3 to 6 correspondingly illustrate the preparation process of forming the structure of the display panel shown in FIG. 1 and are not intended to limit the embodiment of the present disclosure. For example, in other embodiments, the first insulating layer 70 may be located between the third active layer 41 and the base substrate 10, and its implementation steps are similar to the preceding steps.

In S7, a second source and/or a second drain connected to the second active layer are formed on the second via hole, a first source and/or a first drain connected to the first active layer are formed on the first via hole, and a third source and/or a third drain connected to the third active layer are formed on the third via hole.

The first source, the second source, the third source, the first drain, the second drain, and the third drain may be formed by using the same metal. After S7, the structure of the display panel shown in FIG. 1 may be formed. In the preparation process, the dehydrogenation treatment is performed on the second transistor area so that the hydrogen concentration of the second transistor area is lower than the hydrogen concentration of the first transistor area and the subthreshold swing of the second transistor is greater than the subthreshold swing of the first transistor, thereby enabling the display to be more uniform under low brightness and achieving the high-frequency driving of the display panel.

In an embodiment, with continued reference to FIG. 1, in a plane parallel to the base substrate 10, the shortest distance from a first location a in the first area 701 to a sidewall of the first via hole 25 is L, the hydrogen concentration in the first location a is C11, the shortest distance from a second location b in the second area 702 to a sidewall of the second via hole 35 is L, and the hydrogen concentration in the second location b is C22, where C11>C22, and C22<C2.

Since the second via hole 35, after formed, is dehydrogenated and the hydrogen gas is released through the second via hole 35, the hydrogen concentration on the sidewall of the second via hole 35 is low, the distance range containing hydrogen around the sidewall of the second via hole 35 is small, and the hydrogen content is small in the locations with a distance greater than L, while since the first via hole 25 is not dehydrogenated, the hydrogen concentration on the sidewall of the first via hole 25 is high, the hydrogen concentration distribution area is relatively large, and the hydrogen concentration remains large in the locations with a distance greater than L.

Figure 7:
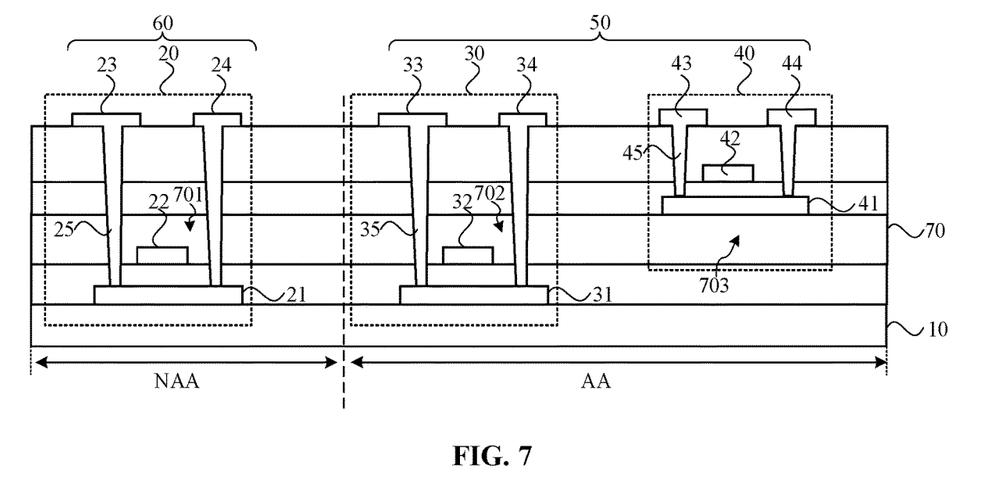
FIG. 7 is a structural diagram of another display panel according to an embodiment of the present disclosure.

FIG. 7 is a structural diagram of another display panel according to an embodiment of the present disclosure. With reference to FIG. 7, the third area 703 of the first insulating layer 70 is in direct contact with the third active layer 41.

For the IGZO active layer, the hydrogen content of a film layer in contact with the IGZO active layer needs to be smaller to avoid the influence of hydrogen on the IGZO active layer. Therefore, the hydrogen gas in the insulating layer in contact with the third active layer 41 needs to be released from the second via hole 35 which is close to the third active layer 41 through the dehydrogenation procedure as far as possible.

In an embodiment, the first insulating layer 70 is located on a side of the third active layer 41 facing the base substrate 10, that is, the first insulating layer 70 is located between the third active layer 40 and the base substrate 10, as shown in FIG. 7.

In an embodiment, the first insulating layer is located on the first active layer and/or the second active layer and is in contact with the first active layer and/or the second active layer; or, the first insulating layer is located on the third active layer and in contact with the third active layer.

Figure 8:
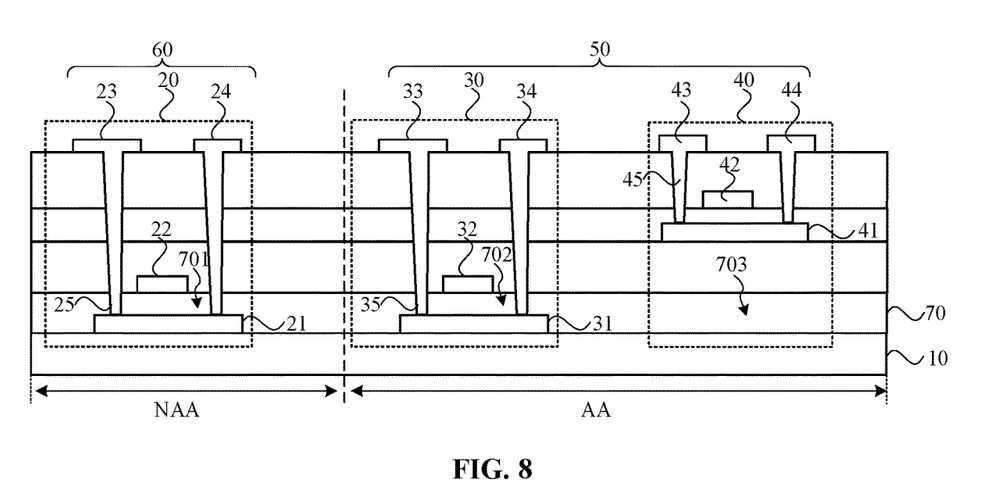
FIG. 8 is a structural diagram of another display panel according to an embodiment of the present disclosure.

For example, FIG. 8 is a structural diagram of another display panel according to an embodiment of the present disclosure. Since the first transistor 20 and the second transistor 30 are of the same type, in order to simplify the process, the first active layer 21 and the second active layer 31 are disposed in the same layer, and the first insulating layer 70 is located above the first active layer 21 and the second active layer 31 and is in contact with the first active layer 21 and the second active layer 31, that is, the first insulating layer 70 is a gate insulating layer of the first transistor 20 and the second transistor 30. In other embodiments, the first active layer and the second active layer can also be disposed in different layers, and the first insulating layer is in direct contact with a certain active layer, which may be designed according to the actual situation in the specific implementation.

Figure 9:
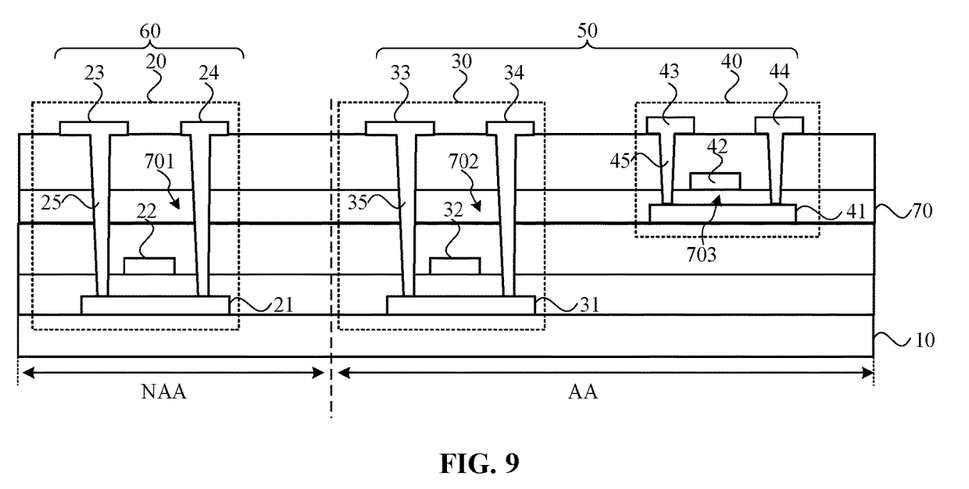
FIG. 9 is a structural diagram of another display panel according to an embodiment of the present disclosure.

FIG. 9 is a structural diagram of another display panel according to an embodiment of the present disclosure. In this embodiment, the first insulating layer 70 is located above the third active layer 41 and is in contact with the third active layer 41. That is, in the embodiment shown in FIG. 8, the first insulating layer is a gate insulating layer of an LTPS transistor, and in the embodiment shown in FIG. 9, the first insulating layer is a gate insulating layer of an IGZO transistor. Since the via hole is opened from the source/drain to the active layer and the gate insulating layer is the film layer closest to the active layer, the hydrogen concentration of the gate insulating layer has a great influence on the active layer. Therefore, the first insulating layer is limited as the gate insulating layer to ensure the characteristics of the active layer.

In an embodiment, the second transistor 20 is a drive transistor of the pixel circuit 50.

The second transistor 20 is designed as a drive transistor of the pixel circuit 50 so that the subthreshold swing of the second transistor 20 becomes large and thus the second transistor 20 gains high stability, thereby enabling the display to be more uniform when the display panel is at a low brightness.

Figure 10:
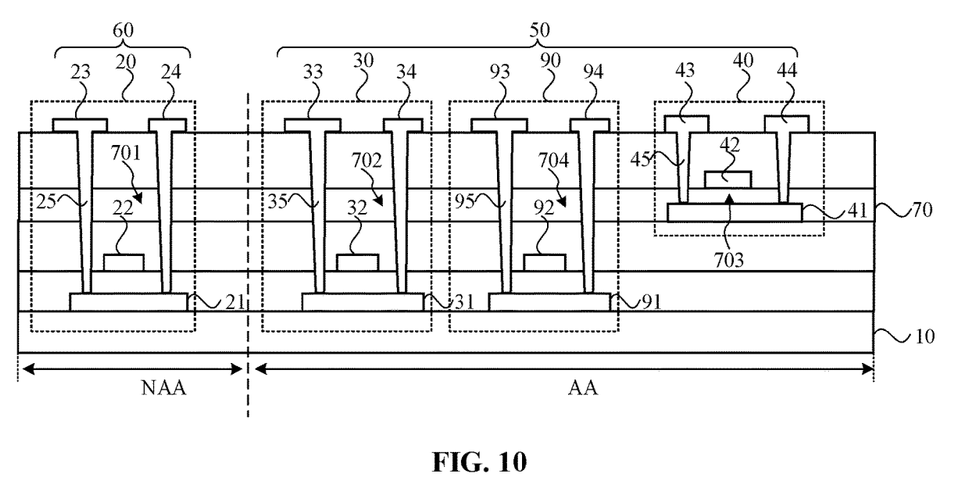
FIG. 10 is a structural diagram of another display panel according to an embodiment of the present disclosure.

FIG. 10 is a structural diagram of another display panel according to an embodiment of the present disclosure. With reference to FIG. 10, in an embodiment, the display panel further includes a fourth transistor 90. The fourth transistor 90 includes a fourth active layer 91, a fourth gate 92, a fourth source 93, and a fourth drain 94, and the fourth active layer 91 contains silicon; where the fourth transistor 90 is a switch transistor of the pixel circuit 50, and the hydrogen concentration in the fourth active layer 91 is higher than the hydrogen concentration in the second active layer 31.

The second transistor 30 is a drive transistor of the pixel circuit 50, and the fourth transistor 90 is a switch transistor. Since the response speed of the switch transistor generally needs to be greater than the response speed of the drive transistor, the hydrogen concentration in the active layer in the switch transistor is set to be higher than the hydrogen concentration in the active layer in the drive transistor so that the subthreshold swing of the switch transistor is larger and thus gains the capability of fast response.

In an embodiment, the hydrogen concentration in the fourth active layer 91 is lower than the hydrogen concentration in the first active layer 21.

Since the distance between the fourth transistor 90 and the second transistor 30 is short, a part of hydrogen gas is released from the second via hole 25 during the dehydrogenation process, causing that the hydrogen concentration of the fourth active layer 91 is lower than the hydrogen concentration of the first active layer 21.

In an embodiment, the first insulating layer 70 extends to the fourth transistor 90 and is located between the fourth source 93 and the fourth active layer 91; the first insulating layer 70 includes a fourth area 704 within which the fourth transistor 90 is located, and the hydrogen concentration in the fourth area 704 is higher than the hydrogen concentration in the second area 702.

In an embodiment, with continued reference to FIG. 10, the fourth source 93 is connected to the fourth active layer 94 via a fourth via hole 95, and the fourth via hole 95 passes through the fourth area 704 of the first insulating layer 70; the hydrogen concentration on a side of the first insulating layer 70 adjacent to the fourth via hole 95 is C4, where C4>C2.

Since the second via hole 25, after formed, is dehydrogenated while no hole is formed in the fourth area 704, the hydrogen concentration in the fourth area 704 is higher than the hydrogen concentration in the second area 702, which helps to reduce the subthreshold swing of the switch transistor.

In an embodiment, C1≥C4.

The first transistor 20 and the fourth transistor 90 are both switch transistors, but the fourth transistor 90 is closer to the second transistor 30 and thus is relatively more affected by the dehydrogenation treatment, so that the hydrogen concentration in the location of the first transistor 20 is higher than or equal to the hydrogen concentration in the location of the fourth transistor 90.

In an embodiment, the preparation method provided in this embodiment, S2 further includes the step described below.

A fourth active layer and a fourth gate are formed, where the fourth active layer contains silicon.

S5 further includes the step described below.

A fourth via hole is formed in the multilayer interlayer insulating layer, where the fourth via hole extends to the fourth active layer.

The fourth via hole may be fabricated simultaneously with the first via hole so that the threshold voltage of the fourth transistor of the switch transistor is also small.

Figure 11:
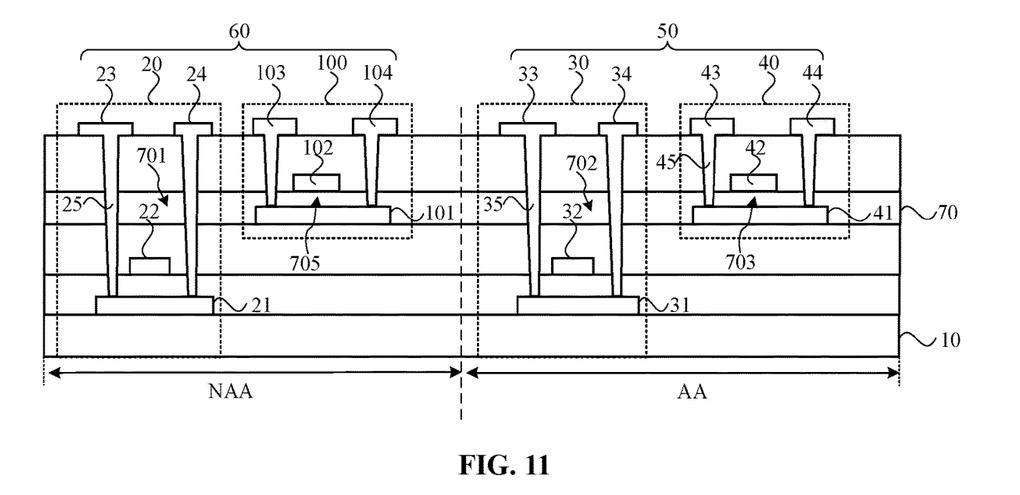
FIG. 11 is a structural diagram of another display panel according to an embodiment of the present disclosure.

FIG. 11 is a structural diagram of another display panel according to an embodiment of the present disclosure. With reference to FIG. 11, in an embodiment, the driver circuit 60 further includes a fifth transistor 100. The fifth transistor 100 includes a fifth active layer 101, a fifth gate 102, a fifth source 103, and a fifth drain 104, and the fifth active layer 101 contains an oxide semiconductor. The first insulating layer 70 further extends to the fifth active layer 101 and at least partially overlaps with the fifth active layer 101, and the first insulating layer 70 overlaps with the fifth active layer 101 in a fifth area 705; the hydrogen concentration in the fifth area 705 is higher than the hydrogen concentration in the third area 703.

Both the fifth transistor 100 and the first transistor 20 are located in the driver circuit 60, and both the second transistor 30 and the third transistor 40 are located in the pixel circuit 60. The third transistor 40 which is closer to the second transistor 30 is affected by the dehydrogenation treatment, and the hydrogen concentration of the insulating layer on the third transistor 40 is lower while the hydrogen concentration on the fifth transistor 100 is higher. Since the third transistor 40 acts as a switch transistor of the pixel circuit 50, the main purpose of the third transistor 40 is to reduce the leakage current of the panel when the panel is driven at a low frequency, and the performance of the third transistor 40 is required to be higher. Therefore, the hydrogen concentration on the third transistor 40 is lower, which helps to ensure the current stability of the pixel circuit in the light emission stage, thereby achieving brightness stability.

Figure 12:
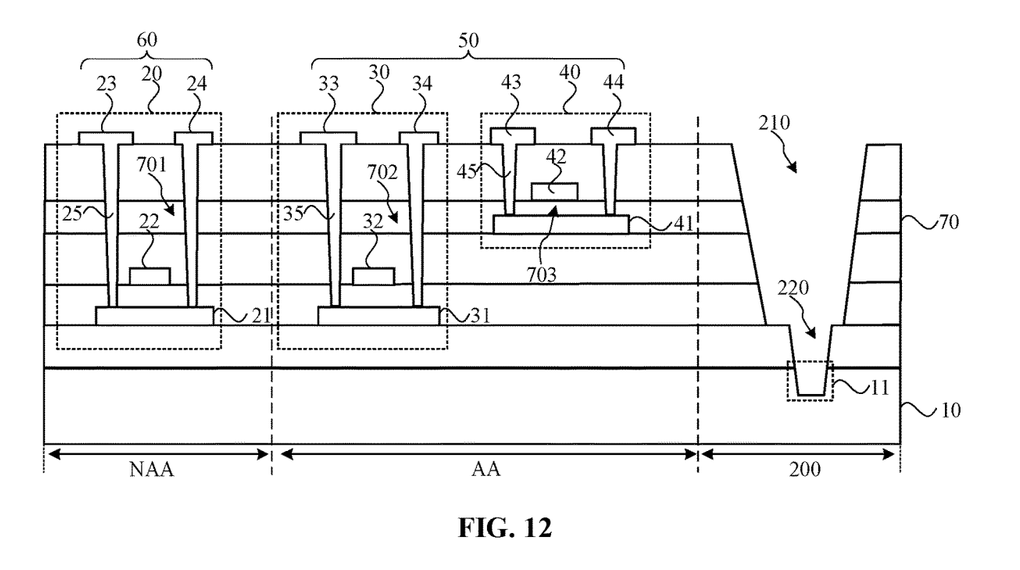
FIG. 12 is a structural diagram of another display panel according to an embodiment of the present disclosure.

FIG. 12 is a structural diagram of another display panel according to an embodiment of the present disclosure. With reference to FIG. 12, in an embodiment, the display panel further includes FIG. 12 is a structural diagram of another display panel according to an embodiment of the present disclosure a bending area 200. The bending area 200 includes a fifth via hole 210 and a sixth via hole 220, the bottom surface of the fifth via hole 210 is a first bottom surface, the sixth via hole 220 is formed on the first bottom surface, and the bottom surface of the sixth via hole 220 is a second bottom surface. The height of the fifth via hole 210 is equal to the height of the second via hole 35; and the height of the sixth via hole 220 is equal to the height of the first via hole 25, or in another embodiment, the height of the sixth via hole 220 is equal to the height of the third via hole 35.

The fifth via hole 210 of the bending area 200 is fabricated simultaneously with the second via hole 35 so that the height of the fifth via hole 210 is the same as the height of the second via hole 35. The sixth via hole 220 is fabricated simultaneously with the first via hole 25 or the third via hole 45 so that the height of the sixth via hole 220 is the same as the height of the first via hole 25 or the third via hole 45. In this way, five via holes can be formed by three via hole processes without adding additional hole processes and without increasing the preparation difficulty.

In an embodiment, the display panel further includes a bending area.

S3 further includes the step described below.

A fifth via hole is formed in the bending area while forming the second via hole in the multilayer interlayer insulating layer, where the height of the fifth via hole is equal to the height of the second via hole.

S5 further includes the step described below.

A sixth via hole is formed in the bending area while forming the first via hole in the multilayer interlayer insulating layer, where the height of the sixth via hole is equal to the height of the first via hole.

In an embodiment, S6 further includes the step described below.

A sixth via hole is formed in the bending area while forming the third via hole in at least part of the insulating layers in the multilayer interlayer insulating layer, where the height of the sixth via hole is equal to the height of the third via hole.

In an embodiment, with continued reference to FIG. 6, the sixth via hole 220 is at least partially located on the base substrate 10, a first groove 11 is formed on the base substrate 10, and the second bottom surface of the sixth via hole 229 is the bottom surface of the first groove 11.

When the sixth via hole 220 is fabricated, the first groove 11 is carved into the base substrate 10, so as to increase the adhesion between an organic layer and the base substrate 10 after the organic layer is filled subsequently, thereby avoiding the problem of cracking between the base substrate and the organic layer and fully improving the bending ability of the bending area.

In an embodiment, S6 further includes the step described below.

A first groove is formed on the base substrate while forming the sixth via hole in the bending area, where the bottom surface of the sixth via hole is a second bottom surface, and the second bottom surface is the bottom surface of the first groove.

Figure 13:
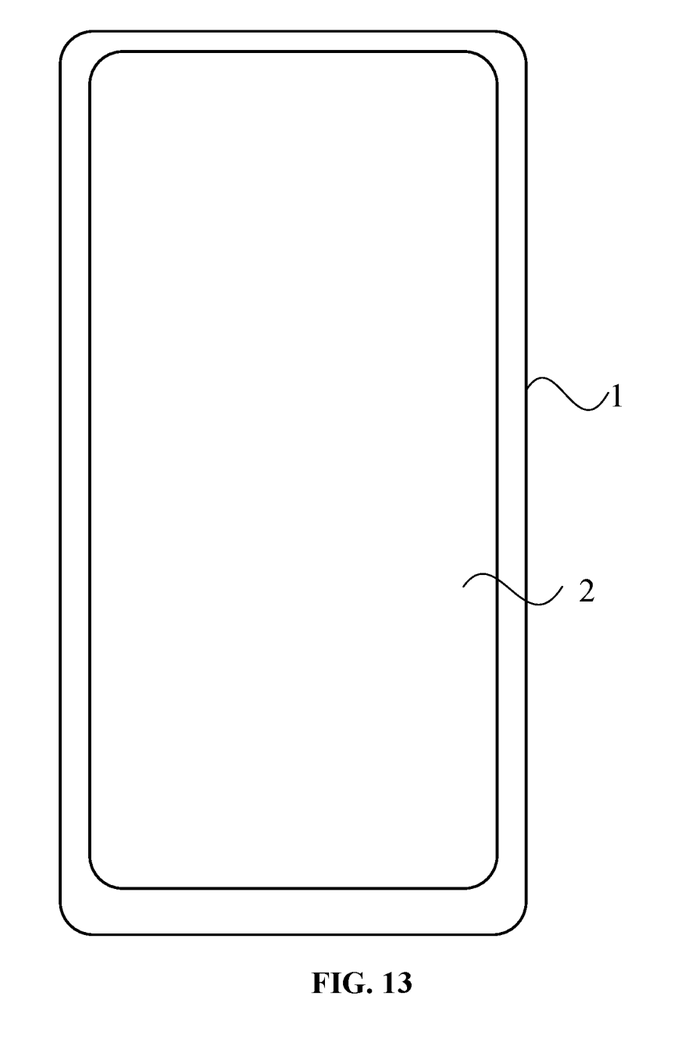
FIG. 13 is a structural diagram of a display device according to an embodiment of the present disclosure.

FIG. 13 is a structure diagram of a display device according to an embodiment of the present disclosure. With reference to FIG. 13, the display device 1 includes any one of the display panels 2 provided in the embodiments of the present disclosure. The display device 1 may be a mobile phone, a computer, an intelligent wearable device, etc.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display panel, comprising:
a base substrate;
a first transistor, wherein the first transistor comprises a first active layer, a first gate, a first source, and a first drain, wherein the first active layer contains silicon;
a second transistor, wherein the second transistor comprises a second active layer, a second gate, a second source, and a second drain, wherein the second active layer contains silicon;
a third transistor, wherein the third transistor comprises a third active layer, a third gate, a third source, and a third drain, wherein the third active layer contains an oxide semiconductor;
a pixel circuit, wherein the pixel circuit supplies a drive current to a display element of the display panel; and
a driver circuit, wherein the driver circuit supplies a drive signal to the pixel circuit; wherein
the driver circuit comprises the first transistor, and the pixel circuit comprises the second transistor and the third transistor; and
a subthreshold swing of the first transistor is SS1, and a subthreshold swing of the second transistor is SS2, wherein SS1<SS2;
the first transistor comprises a first insulating layer, wherein the first insulating layer is located between the first source or the first drain and the first active layer, and the first insulating layer extends to the second transistor and is located between the second source and the second active layer or between the second drain and the second active layer;
wherein the first insulating layer is located in a first area in the first transistor, the first insulating layer is located in a second area in the second transistor, and a hydrogen concentration in the first area is higher than a hydrogen concentration in the second area.

2. The display panel of claim 1, wherein
a hydrogen concentration in the first active layer is higher than a hydrogen concentration in the second active layer.

3. The display panel of claim 1, wherein
the first source is connected to the first active layer through a first via hole, and the second source is connected to the second active layer through a second via hole; and
the first via hole passes through the first area of the first insulating layer, and the second via hole passes through the second area of the first insulating layer;
wherein a hydrogen concentration on a side of the first insulating layer adjacent to the first via hole is C1, and a hydrogen concentration on a side of the first insulating layer adjacent to the second via hole is C2, wherein C1>C2.

4. The display panel of claim 3, wherein
in a plane parallel to the base substrate, a shortest distance from a first location in the first area to a sidewall of the first via hole is L, a hydrogen concentration in the first location is C11, a shortest distance from a second location in the second area to a sidewall of the second via hole is L, and a hydrogen concentration in the second location is C22, wherein C11>C22, and C22<C2.

5. The display panel of claim 3, wherein
the first insulating layer further extends to the third transistor and at least partially overlaps with the third active layer, and the first insulating layer overlaps with the third active layer in a third area;
the hydrogen concentration in the first area is higher than a hydrogen concentration in the third area.

6. The display panel of claim 5, wherein
the third area of the first insulating layer is in direct contact with the third active layer.

7. The display panel of claim 6, wherein
the first insulating layer is located on a side of the third active layer facing the base substrate.

8. The display panel of claim 5, wherein
the first insulating layer is located on a side of the third active layer away from the base substrate, and the third source is connected to the third active layer through a third via hole;
wherein the third via hole passes through the third area of the first insulating layer, and a hydrogen concentration on a side of the first insulating layer adjacent to the third via hole is C3, wherein C1>C3.

9. The display panel of claim 8, wherein
C3>C2.

10. The display panel of claim 8, wherein
the display panel comprises a bending area, wherein the bending area comprises a fifth via hole and a sixth via hole, a bottom surface of the fifth via hole is a first bottom surface, the sixth via hole is formed on the first bottom surface, and a bottom surface of the sixth via hole is a second bottom surface;
wherein a height of the fifth via hole is equal to a height of the second via hole; and
a height of the sixth via hole is equal to a height of the first via hole or the height of the sixth via hole is equal to a height of the third via hole.

11. The display panel of claim 5, wherein
the driver circuit further comprises a fifth transistor, wherein the fifth transistor comprises a fifth active layer, a fifth gate, a fifth source, and a fifth drain, and the fifth active layer contains an oxide semiconductor; and
the first insulating layer further extends to the fifth active layer and at least partially overlaps with the fifth active layer, and the first insulating layer overlaps with the fifth active layer in a fifth area;

wherein a hydrogen concentration in the fifth area is higher than the hydrogen concentration in the third area.

12. The display panel of claim 1, wherein
the first insulating layer is located on at least one of the first active layer or the second active layer and is in contact with at least one of the first active layer or the second active layer; or
the first insulating layer is located on the third active layer and is in contact with the third active layer.

13. The display panel of claim 1, wherein
the second transistor is a drive transistor of the pixel circuit.

14. The display panel of claim 13, wherein
the display panel further comprises a fourth transistor, wherein the fourth transistor comprises a fourth active layer, a fourth gate, a fourth source, and a fourth drain, and the fourth active layer contains silicon;
wherein the fourth transistor is a switch transistor of the pixel circuit, and a hydrogen concentration in the fourth active layer is higher than the hydrogen concentration in the second active layer.

15. The display panel of claim 14, wherein
a hydrogen concentration in the fourth active layer is lower than the hydrogen concentration in the first active layer.

16. The display panel of claim 14, wherein
the first insulating layer extends to the fourth transistor and is located between the fourth source and the fourth active layer;
wherein the first insulating layer comprises a fourth area within which the fourth transistor is located, and a hydrogen concentration in the fourth area is higher than the hydrogen concentration in the second area.

17. The display panel of claim 16, wherein
the fourth source is connected to the fourth active layer via a fourth via hole, and the fourth via hole passes through the fourth area of the first insulating layer;
wherein a hydrogen concentration on a side of the first insulating layer adjacent to the fourth via hole is C4, wherein C4>C2.

18. The display panel of claim 17, wherein
C1≥C4.

19. A display device, comprising a display panel;
wherein the display panel comprises:
a base substrate;
a first transistor, wherein the first transistor comprises a first active layer, a first gate, a first source, and a first drain, wherein the first active layer contains silicon;
a second transistor, wherein the second transistor comprises a second active layer, a second gate, a second source, and a second drain, wherein the second active layer contains silicon;
a third transistor, wherein the third transistor comprises a third active layer, a third gate, a third source, and a third drain, wherein the third active layer contains an oxide semiconductor;
a pixel circuit, wherein the pixel circuit supplies a drive current to a display element of the display panel; and
a driver circuit, wherein the driver circuit supplies a drive signal to the pixel circuit; wherein
the driver circuit comprises the first transistor, and the pixel circuit comprises the second transistor and the third transistor; and
a subthreshold swing of the first transistor is SS1, and a subthreshold swing of the second transistor is SS2, wherein SS1<SS2;
the first transistor comprises a first insulating layer, wherein the first insulating layer is located between the first source or the first drain and the first active layer, and the first insulating layer extends to the second transistor and is located between the second source and the second active layer or between the second drain and the second active layer;
wherein the first insulating layer is located in a first area in the first transistor, the first insulating layer is located in a second area in the second transistor, and a hydrogen concentration in the first area is higher than a hydrogen concentration in the second area.

\* \* \* \* \*